United States Patent [19]
Chan et al.

[11] Patent Number: 5,889,713
[45] Date of Patent: Mar. 30, 1999

[54] TESTING OF EMBEDDED MEMORY BY COUPLING THE MEMORY TO INPUT/OUTPUT PADS USING SWITCHES

[75] Inventors: Tsiu Chiu Chan, Carrollton; Lawrence P. Eng, Dallas, both of Tex.

[73] Assignee: STMicroelectronics, Inc., Carrollton, Tex.

[21] Appl. No.: 891,284

[22] Filed: Jul. 10, 1997

Related U.S. Application Data

[63] Continuation of Ser. No. 626,499, Apr. 2, 1996, abandoned.

[51] Int. Cl.$^6$ .................................................. G11C 7/00
[52] U.S. Cl. ................................................. 365/201; 365/63
[58] Field of Search ................................. 365/200, 201, 365/63

[56] References Cited

U.S. PATENT DOCUMENTS

| | | | |
|---|---|---|---|
| 3,961,251 | 6/1976 | Hurley et al. | 324/73 AT |
| 4,339,710 | 7/1982 | Hapke | 324/73 R |
| 4,398,146 | 8/1983 | Draheim et al. | 324/73 R |
| 4,481,627 | 11/1984 | Beauchesne et al. | 371/21 |
| 4,698,588 | 10/1987 | Hwang et al. | 324/158 R |
| 4,743,841 | 5/1988 | Takeuchi | 324/73 R |
| 4,811,306 | 3/1989 | Böning et al. | 365/200 |
| 4,860,260 | 8/1989 | Saito et al. | 365/200 |
| 5,107,208 | 4/1992 | Lee | 324/158 R |
| 5,254,940 | 10/1993 | Oke et al. | 324/158 R |
| 5,255,227 | 10/1993 | Haeffele | 365/200 |
| 5,299,160 | 3/1994 | Mori | 365/200 |
| 5,299,203 | 3/1994 | Steele | 371/22.1 |
| 5,301,143 | 4/1994 | Ohri et al. | 365/96 |
| 5,309,446 | 5/1994 | Cline et al. | 365/201 |
| 5,311,473 | 5/1994 | McClure et al. | 365/201 |
| 5,337,318 | 8/1994 | Tsukakoshi et al. | 371/5.5 |
| 5,377,146 | 12/1994 | Reddy et al. | 365/200 |
| 5,381,372 | 1/1995 | Kozuka et al. | 365/201 |
| 5,410,544 | 4/1995 | Kreifels et al. | 371/18 |
| 5,469,075 | 11/1995 | Oke et al. | 324/763 |
| 5,471,431 | 11/1995 | McClure | 365/225.7 |
| 5,485,424 | 1/1996 | Kawamura | 365/200 |
| 5,661,690 | 8/1997 | Roohparvar | 365/201 |
| 5,692,138 | 11/1997 | Fandrich et al. | 395/310 |
| 5,696,715 | 12/1997 | Maejima et al. | 365/177 |

FOREIGN PATENT DOCUMENTS 0 446 534 A2   9/1991   European Pat. Off. .

Primary Examiner—David Nelms
Assistant Examiner—M. Tran
Attorney, Agent, or Firm—David V. Carlson; Theodore E. Galanthay; Lisa K. Jorgenson

[57] ABSTRACT

A method and circuits for coupling a memory embedded in an integrated circuit to interconnect pads during a memory test mode is disclosed. The integrated circuit contains a processor, an embedded memory and a switching circuit for: (1) temporary coupling the interconnect pads of the integrated circuit, coupled to the processor during normal operation mode of the circuit, to the memory during a memory test mode; (2) and decoupling the external interconnect pads from the memory, after the memory is tested, and coupling them to the processor.

38 Claims, 3 Drawing Sheets

TESTING OF EMBEDDED MEMORY BY COUPLING THE MEMORY TO INPUT/OUTPUT PADS USING SWITCHES

This is a continuation of application Ser. No. 08/626,499 filed Apr. 2, 1992, now abandoned.

CROSS-REFERENCE TO RELATED APPLICATIONS

This application contains text in common with pending U.S. patent application entitled "Testing and Repair of Embedded Memory" by Tsiu C. Chan and Lawrence P. Eng Ser. No. 08/626,540 (Attorney's Docket No. 95-C-164), which has the same effective filing date and ownership as the present application, and to that extent is arguably related to the present application, which is incorporated herein by reference.

BACKGROUND AND SUMMARY OF THE INVENTION

The present invention relates to the field of electronic devices having embedded memory, and is more specifically directed to the testing and repairing of the embedded memory.

Embedded memory is memory that is embedded with a processor. The embedded memory can be the memory necessary for the core functionality of the processor, it can also be the data storage memory, where the data that the processor processes is stored. Many processors contain a small amount of memory, typically on the order of several kilo bits, which is typically arranged into memory registers and is necessary for the core functionality of the processor.

The data storage memory is much larger than the memory that is needed for the processor for its core functionality. Currently this memory is usually external memory, i.e. it is not embedded on the same integrated circuit that the processor is on because of the low yield of the process in manufacturing the circuit and the expense of testing and repairing the memory. A goal in the semiconductor industry is to increase the speed of the processor. One way to increase the speed of the processor is to embed the memory used for data storage into the processor.

When memory used for data storage is on a separate chip than the processor the two chips must be electrically coupled. The input/output pins of the processor are coupled to the input/output pins of the memory by external metal connections. This increases the amount of time it takes for the processor to read data out of the memory and write data into the memory. Embedding the memory into the processor reduces the amount of time the processor takes to access the memory. Additionally, since the memory now does not require the external input/output pins previously needed for coupling to the processor, the packaging cost of the memory is greatly reduced. Furthermore, the memory can now be specifically configured for the processor into which it is embedded. Embedding the memory in the processor also eliminates the need for the external metal connections, increasing the accuracy of the connections in the combined product.

For example, a standard memory device design can be embedded in the processor, with the memory array and peripheral circuits needed to operate the memory array coupled to the processor. Since most standard memory devices have input/output pads, the embedded memory would have the input/output pads but they would be disconnected from the memory array and memory peripheral circuits. Although, since the input/output pads are disconnected from the memory array and peripheral circuits, they are not necessary for the functioning of the memory and may be removed. This frees up the space previously occupied by these pads, thereby reducing the total size of the memory. However, this would require a memory devices manufactured without the input/output pads.

Both the memory and the processors are tested to ensure that they do not malfunction. Every cell in a memory is typically tested to ensure that there are no defective cells. A fatal defect in one memory cell makes the cell inoperable. If the cell is not replaced the entire memory device can malfunction. Therefore, a defective memory cell must either be replaced, or the entire chip discarded. When the memory is embedded in a processor the cost of discarding the chip increases.

As the component size is reduced and the density of components per unit area of a semiconductor device is increased, the costs of the device decreases while its speed increases. However, as the size of components decreases and their density increases the size of a defect that can cause failure also shrinks. Additionally, as the speed with which processors process data increases, the amount of data that can be made available to the processors also increases, usually by increasing the size of the memory for storing data. As the size of and total number of components in a memory device continues to increase, so does the cost of each memory device, and therefore the cost of each non-usable memory device.

Redundant columns and/or rows are often used in memory devices to prevent an isolated defect from destroying the entire device. The decision on whether to use redundant columns and/or rows is based on balancing the additional die space needed for the redundancy architecture and the yield of the manufacturing process if redundancy is not used. If the yield is high enough, it is cheaper to discard the few memories with defective cell than add the redundancy architecture to each memory. If the yield is not sufficiently high, the redundancy architecture can greatly decrease the yield loss in these memory devices by replacing a column or row containing a defect in one of its memory cells with a redundant column or row. This can save a memory device that would otherwise have been unusable.

The defects in the memory cells are discovered in initial testing, and the redundant columns or rows can then be activated to replace the columns or rows containing defective cells. Extensive testing is performed on the memory to determine which if any of the memory cells are defective. The test equipment for testing memories is coupled to the input/output pads of the memory. When a memory is embedded into the processor this is usually is not possible. There are either no external input/output pads on the memory for the test equipment to connect to; or some external input/output pads remain, but not enough to test every memory cell. Thus the memory must be tested through the processor.

Processors are also tested to ensure that they function properly. The test equipment for testing processors is coupled to the input/output pads of the processor.

A problem in the prior art is that the cost of testing a chip increases when a memory is embedded in a processor. This is especially true for the testing required to discover which memory cell is defective. To find exactly which memory cell is defective the memory must be extensively tested. In modern technology, embedded memory is tested through the processor, using the input/output pads of the processor since the memory does not have, or does not have enough of, its own input/output pads. The testing equipment for the processors is at least several times more expensive than comparable testing equipment for memories. Both the memory and the processor must now be tested on the processor testing equipment, increasing the amount of time each chip is required to spend on the processor testing equipment by the amount of time it takes to perform the memory tests. Therefore, either:

(1) more very expensive processor testing equipment must be used to test both the processor and the memories which can now only be tested through the processor, drastically increasing the cost of each chip; or (2) the cycle time of producing a given number of processors containing embedded memories will be much larger than for processors without embedded memories.

Both of these increase the cost of the chip, whether the memory will be repaired or not, since either way each memory cell must still be tested. Although when the memory will also be repaired the test time and therefore the cost is even greater. When the memory is small this increase is small. However, when the memory is the size of a memory used for data storage, which can range from hundreds of kilo bits to many Mega bits or more, this increase is prohibitively expensive. This makes the cost of embedding memories for data storage into processor impractical despite all the advantages, described above, obtained from embedding the memory into the processor, and hinders the achievement of the long recognized goal to increase the speed with which the processor can access data.

SUMMARY OF THE INVENTION

The present application discloses a method and circuits for coupling an embedded memory to the interconnect pads through a switching circuit during a memory test mode. This allows the memory to be coupled through the interconnect pads to memory test equipment, and to be tested on memory test equipment, instead of being tested on the processor test equipment. In the memory test mode the memory is coupled to the interconnect pads. In the normal operation of the circuit the processor, to which the memory is coupled to, is coupled to the interconnect pads.

A significant advantage of the present invention is that the majority of the memory testing can be performed using the less expensive memory test equipment instead of the more expensive processor test equipment.

Another advantage of the present invention is that a memory without its own memory interconnect pads can be used, or the number of memory interconnect pads can be reduced, saving die space.

Other advantages and objects of the invention will be apparent to those of ordinary skill in the art having reference to the following specification together with the drawings.

DETAILED DESCRIPTION OF THE PREFERRED EMBODIMENT

Figure 1:
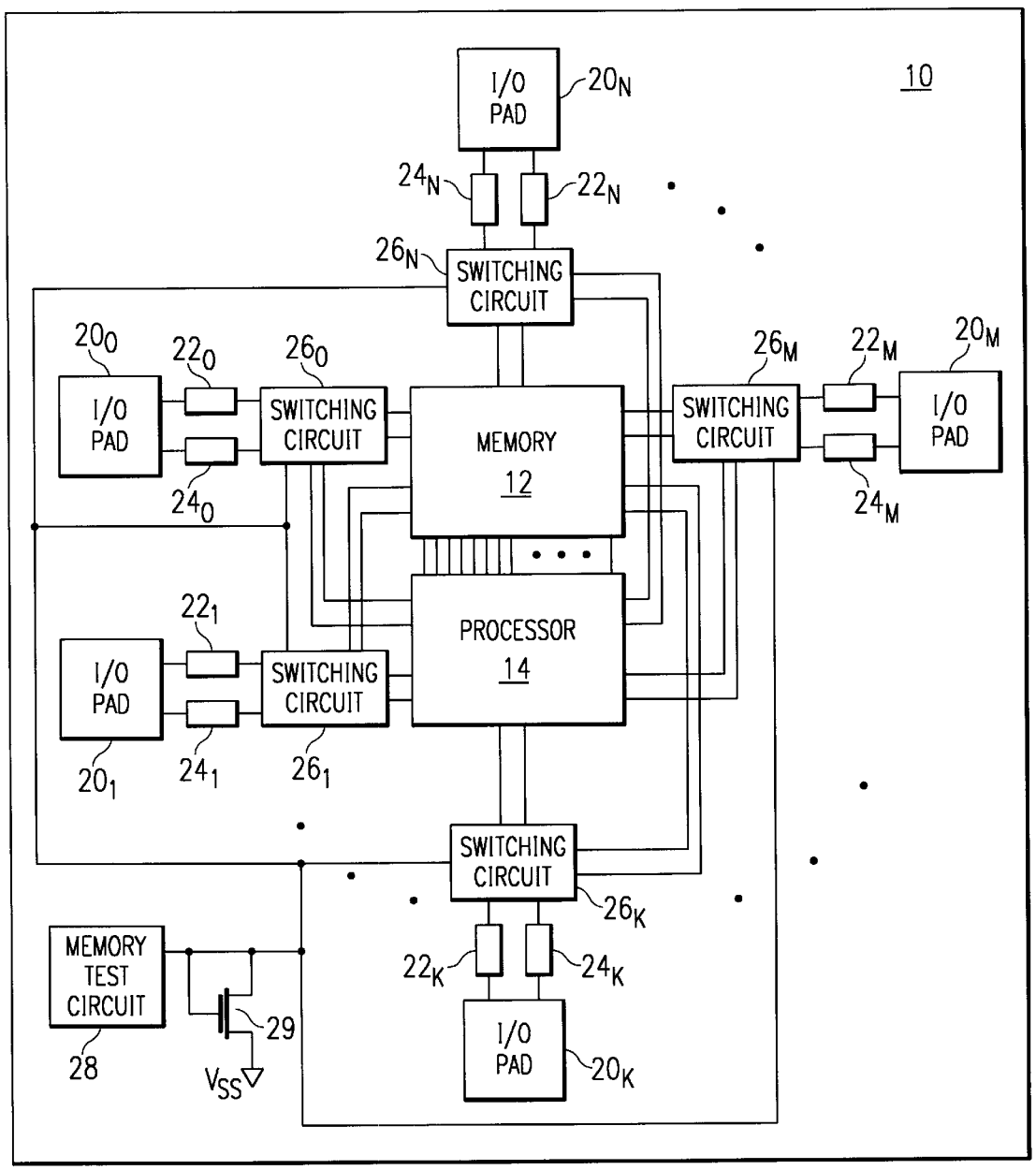
FIG. 1 is an electrical diagram, in block form, of an integrated circuit containing embedded memory according to an embodiment of the present invention.

FIG. 1 shows an integrated circuit 10 containing an embedded memory according to an embodiment of the present invention. Integrated circuit 10 contains a memory 12, a processor 14, and interconnect pads $20_0, \ldots 20_N$. The memory 12 is coupled to the processor 14. In the current technology DRAMS are typically used for data storage, although any conventional memory can be used, such as SRAMs, which can be more compatible with the processor fabrication technology. Each of the interconnect pads $20_0, \ldots 20_N$ can be an input/output pad, just an input pad, or just an output pad depending on the functionality of the integrated circuit's 10 component that the pad is coupled to. Input circuits $22_0, \ldots 22_N$ are coupled to the input/output pads and to input pads, and output circuits $24_0, \ldots 24_N$ are coupled to the input/output pads and to output pads. Electrostatic-discharge protection components can be coupled to the interconnect pads $20_0, \ldots 20_N$.

Switching circuits $26_0, \ldots 26_N$ are coupled to the interconnect pads $20_0, \ldots 20_N$. Switching circuits $26_0, \ldots 26_N$ are also coupled to the memory 12 and processor 14.

The switching circuits $26_0, \ldots 26_N$ are controlled by a memory test circuit 28. The output of the memory test circuit is coupled to the control input of each of the switching circuits. The memory test circuit can be located anywhere on the integrated circuit 10. In the preferred embodiment, the memory test circuit 28 is simply a memory test pad (hereinafter memory test pad 28), although any conventional memory test circuit that is capable of producing two distinguishable logic states at its output can be used. A current limiting device 29 is coupled between the output of the memory test pad 28 and the control inputs of the switching circuits $26_0, \ldots 26_N$. The current limiting device 29 can be any device that reduces or eliminates the power dissipation when the memory test pad is low. The current limiting device 29 can be any device that produces a large resistance, and is preferably an n-channel transistor (hereinafter transistor 29) whose length is much greater than its width. The length to width ratio of transistor 29 in the preferred embodiment is on the order of 100 to 1.

The switching circuits $26_0, \ldots 26_N$ allow the interconnect pads $20_0, \ldots 20_N$ to be coupled to the memory 12 or to the processor 14. There must be enough switching circuits $26_0, \ldots 26_N$ such that enough interconnect pads $20_0, \ldots 20_N$ can be coupled to the memory 12 to allow the memory 12 to be coupled to memory test equipment and tested. In the integrated circuit 10 shown in FIG. 1 all of the interconnect pads $20_0, \ldots 20_N$ are coupled to a switching circuit $26_0, \ldots 26_N$, respectively. However, in alternative embodiments of the invention some interconnect pads $20_0, \ldots 20_N$ may be coupled to just the processor 14, or just to the memory 12.

One of the interconnect pads $20_0, \ldots 20_N$ is coupled to the input of each of the switching circuits $26_0, 26_N$, respectively. The processor 14 is coupled to the first output of each of the switching circuits $26_0, \ldots 26_N$. The memory 12 is coupled to the second output of each of the switching circuits $26_0, \ldots 26_N$.

In the normal operation of the circuit the processor 14 is coupled to the interconnect pads $20_0 \ldots 20_N$ through the switching circuits $26_0, \ldots 26_N$ responsive to a first logic state on the memory test pad 28. The first logic state is preferably low since this does not require the memory test pad 28 to dissipate power during the normal operating mode of the integrated circuit 10, which it is in most of the time. In the preferred embodiment of the invention, the memory is not coupled to the interconnect pads $20_0 \ldots 20_N$ in the normal operation of the circuit. When the circuit enters the normal operation mode interconnect pads $20_0 \ldots 20_N$ are coupled to the processor 14. When the circuit 10 enters the normal operation mode from the memory test mode the interconnect pads $20_0 \ldots 20_N$ are decoupled from the memory 14 and coupled to the processor 14. In the preferred embodiment of the invention this occurs simultaneously.

In a memory test mode, the logic state on the memory test pad 28 is high causing the switching circuit to couple the interconnect pads $20_0 \ldots 20_N$ to the memory 12, and to decouple the interconnect pads $20_0 \ldots 20_N$ from the processor 14 if they are coupled to the processor 14 when the circuit enters the memory test mode. In the preferred embodiment of the invention this occurs simultaneously when the circuit enters the memory test mode. Coupling the memory 12 to the interconnect pads $20_0 \ldots 20_N$ allows the interconnect pads to control the memory 12. The interconnect pads $20_0 \ldots 20_N$ can be coupled to the memory test equipment and the memory 12 can be tested.

This initial testing is typically quite thorough and the defects in the memory cells are usually discovered during this initial testing. If redundant columns or rows are available in the memory, the redundant columns or rows can now be activated to replace the columns or rows containing defective cells. Extensive testing is performed on the memory to determine which if any of the memory cells are defective. The decision on whether to use a redundancy architecture is based on balancing the additional die space needed for the redundancy architecture and the yield of the manufacturing process if redundancy is not used. If the yield is high enough, it is cheaper to discard the few memories with defective cell than add the redundancy architecture to each memory. If the yield is not sufficiently high, the redundancy architecture can greatly decrease the yield loss in these memory devices by replacing a column or row containing a defect in one of its memory cells with a redundant column or row. This can save a device that would otherwise have been unusable.

The processor is tested to ensure that it functions properly. The processor can be tested before or after the memory is tested. Connections between the memory and the processor are also tested. The connections are tested by accessing the memory thorough the processor. Testing the connections is a much shorter test then the initial memory test, not requiring long use of the expensive processor test equipment. The processor and the connections are typically tested in the electronic wafer sort.

In the prior art the processor and embedded memory are tested in a continuous process. In the preferred embodiment of the invention, the memory is tested first on separate memory testing equipment, and a flag bit in the memory is set to a third logic state to mark that memory is non-defective or to a forth logic state to mark that the memory is defective. If the flag bit is set to the third logic state the die is tested in the electronic wafer sort.

After both the processor and the memory are tested, and typically after the integrated circuit 10 is packaged, the final test is performed on the integrated circuit 10. The memory is usually tested through the processor in the final test. The memory is tested for again a much shorter time in the final test then in the initial memory test. Coupling the memory 12 to the interconnect pads $20_0 \ldots 20_N$ permits majority of the memory testing to be performed on the much less expensive memory test equipment instead of on the much more expensive processor test equipment.

Figure 2:
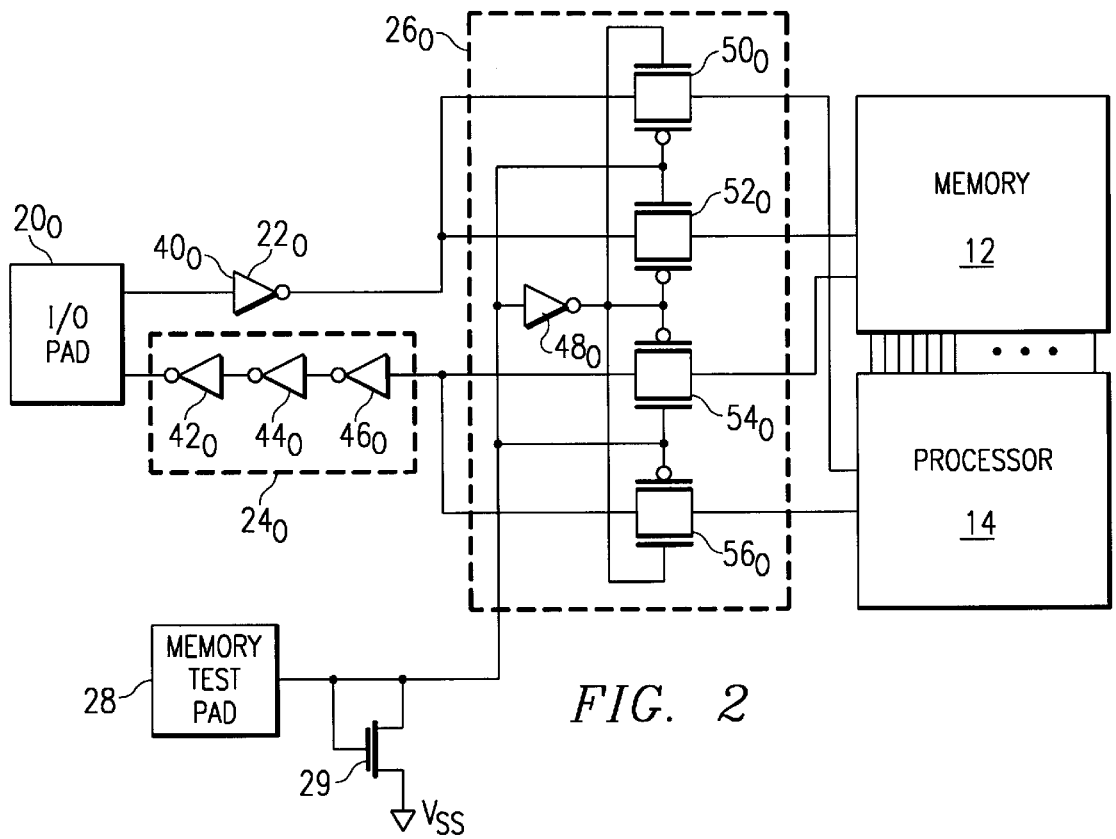
FIG. 2 is an electrical diagram, in schematic form, of the integrated circuit of FIG. 1 containing one embodiment of the switching circuit according to the present invention.

FIG. 2 shows one placement of one embodiment of the switching circuit $26_0$ coupled to the memory 12, the processor 14, one placement of the interconnect pad $20_0$, one placement of the input circuit $22_0$, and one placement of the output circuit $24_0$. In the preferred embodiment of the invention input circuit $22_0$ is an inverter $40_0$, and output circuit $24_0$ is several inverters connected in series, $42_0$, $44_0$, $46_0$, although any conventional input circuit and any conventional output circuit can be used.

Figure 3:
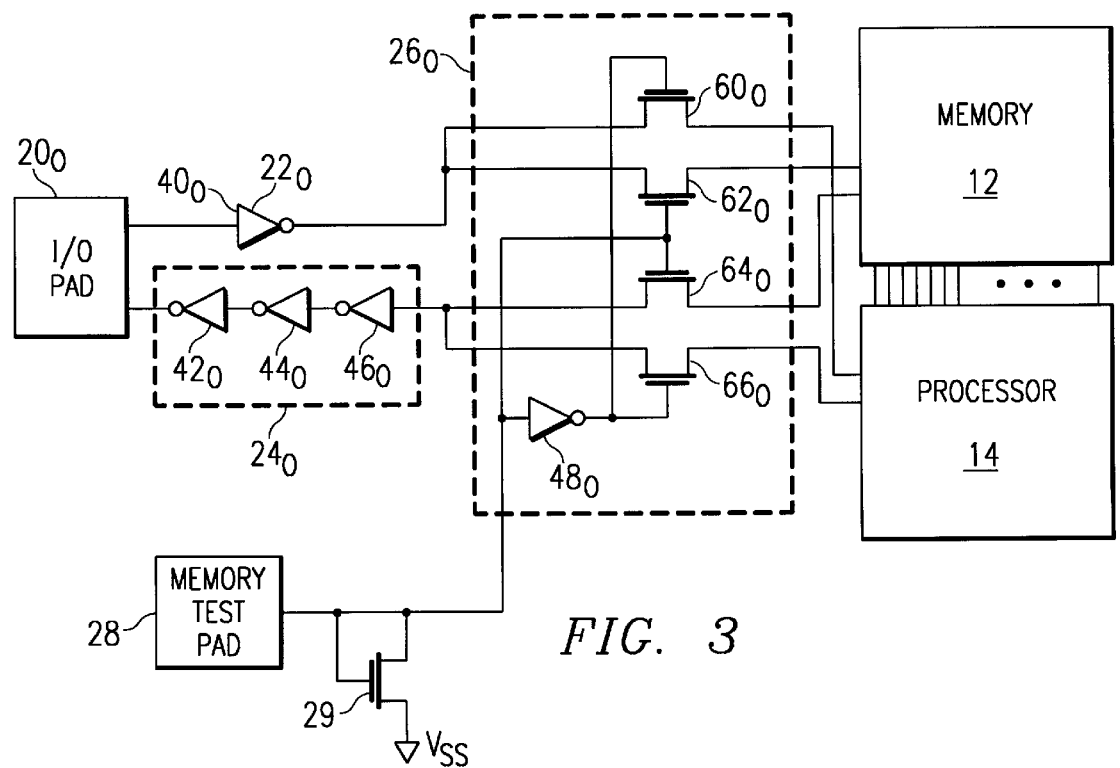
FIG. 3 is an electrical diagram, in schematic form, of the integrated circuit of FIG. 1 containing another embodiment of the switching circuit according to the present invention.

Switching circuit $26_0$ contains a first and second pair of pass elements. In one preferred embodiment of the switching circuit $26_0$ pass elements are pass gates $50_0$, $56_0$, $52_0$, $54_0$, of complementary transistors with their conduction paths connected in parallel, although any other conventional component or combination of components for passing a signal, such as a single transistor can be used. FIG. 3 shows another preferred embodiment using a single n-channel transistor as a pass element.

Referring again to FIG. 2, the first pair of pass gates $50_0$, $56_0$ are coupled between the interconnect pad 200 and the processor 14. The second pair of pass gates $52_0$, $54_0$ are coupled between the interconnect pad 200 and the memory 12. The pass gates are controlled by the memory test pad 28 and an inverter $48_0$ coupled to the p-channel transistors of the second pair of pass gates $52_0$, $54_0$ and to the n-channel transistors of the first pair of pass gates $50_0$, $56_0$. When the logic state on the memory test pad 28 is low, the first pair of pass gates $50_0$, $56_0$ are on coupling the interconnect pad $20_0$ to the processor 14. The second pair of pass gates $52_0$, $54_0$ are off, decoupling the interconnect pad $20_0$, from the memory 12. When the logic state on the memory test pad 28 is high, the second pair of pass gates $52_0$, $54_0$ are on, coupling the interconnect pad $20_0$ to the memory 12. The first pair of pass gates $50_0$, $56_0$ are off, decoupling the interconnect pad $20_0$ from the processor 14.

FIG. 3 shows one placement of another preferred embodiment of the switching circuit $26_0$ coupled to the memory 12, the processor 14, and one placement of the interconnect pad $20_0$. The first and second pair of pass elements in this embodiment of the switching circuit $26_0$ are n-channel transistors $60_0$ and $66_0$, and $62_0$ and $64_0$, respectively. The first pair of transistors $60_0$, $66_0$ are coupled between the interconnect pad $20_0$ and the processor 14. The second pair of transistors $62_0$, $64_0$ are coupled between the interconnect pad $20_0$ and the memory 12. The first pair of transistors $60_0$, $66_0$ are controlled by the memory test pad 28 and an inverter $48_0$ coupling the interconnect pad $20_0$ to the processor 14 when the logic state on the memory test pad 28 is low and decoupling the interconnect pad $20_0$ from the processor 14 when the logic state on the memory test pad 28 is high. The second pair of transistors $62_0$ and $64_0$ are controlled by the memory test pad 28, coupling the interconnect pad $20_0$ to the memory 12 when the logic state on the memory test pad 28 is high and decoupling interconnect pad $20_0$ from the memory 12 when the logic state on the memory test pad 28 is low.

Therefore the invention allows a memory to be embedded in a processor, and tested using the interconnect pads $20_0 \ldots 20_N$. This provides the advantages of reducing the access time of the memory and the cost of the memory by embedding a memory without the increased costs of fully testing the embedded memory on the more expensive processor test equipment. Additionally, since the memory is tested on the integrated circuits interconnect pads $20_0 \ldots 20_N$, the memory interconnect pads are not needed and the memory can be manufactured without them, providing space savings on each embedded memory.

Embedding a memory in a processor, and testing the memory using the interconnect pads $20_0 \ldots 20_N$ is accomplished through the above described method of temporarily coupling the memory to one or more of the interconnect pads, testing the memory, and decoupling said memory from the first interconnect pads.

Figure 4:
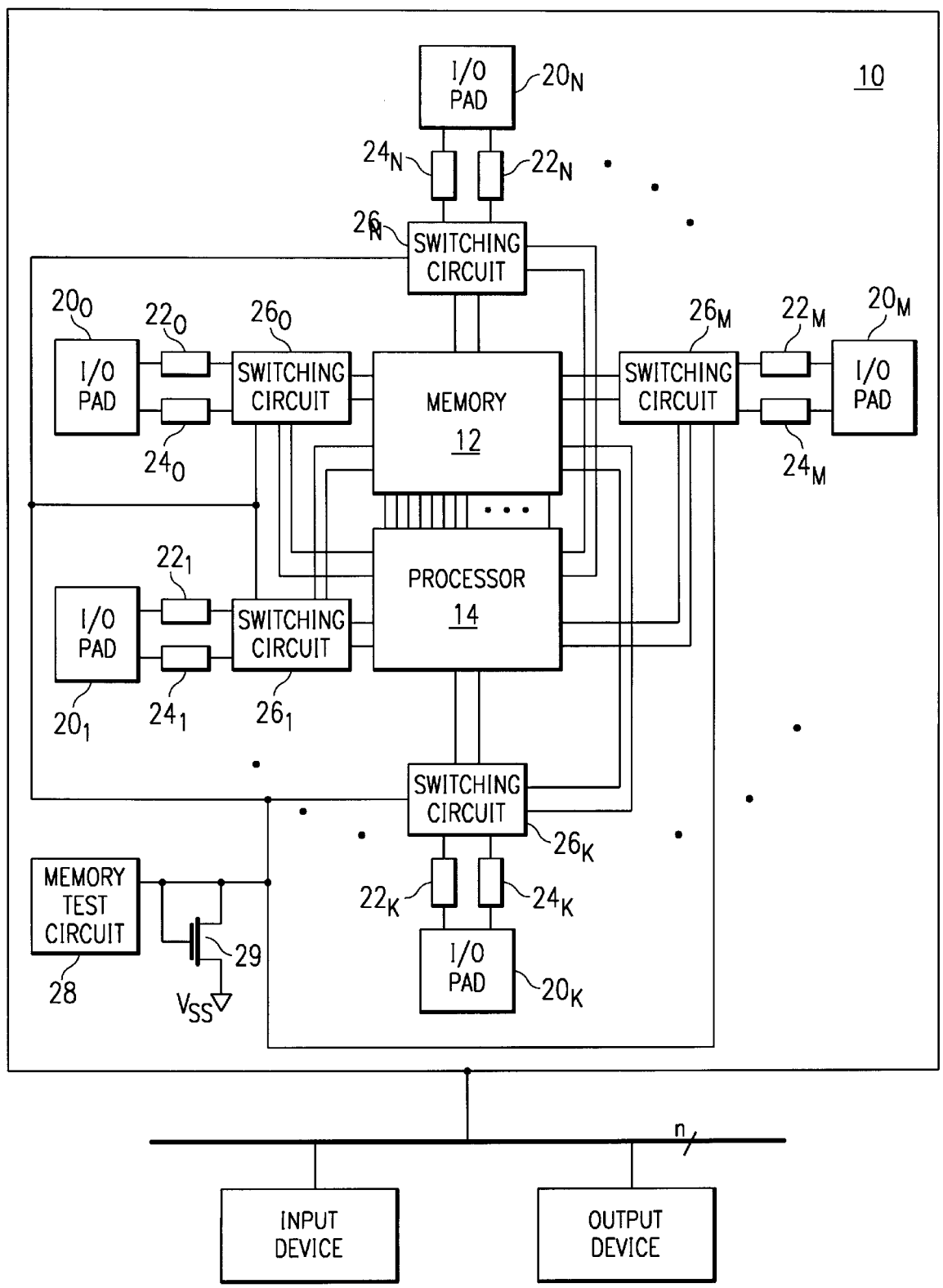
FIG. 4 is an electrical diagram, in block form, of a computer containing the integrated circuit containing embedded memory according to the present invention.

The processors with embedded memories can be used in computers, as shown in FIG. 4. This type of integrated circuit 10 is also particularly useful in medical equipment where quick access to the data stored in the memory can increase the accuracy as well as the speed of the equipment.

The invention is also useful in designing custom processors with chip cache memory. It is particularly useful in graphics devices where quicker access by the processor to the data stored in memory can improve the resolution and detail of both two and three dimensional graphics.

Further background on memories and on the testing and repairing of memories and processors can be found in: Prince, Betty, SEMICONDUCTOR MEMORIES, A HANDBOOK OF DESIGN, MANUFACTURE, AND APPLICATION, $2^{nd}$ ed., John Wiley & Sons, 1991; Zaks, Rodnay, and Alexander Wolfe, FROM CHIPS TO SYSTEMS: AN INTRODUCTION TO MICROCOMPUTERS, $2^{nd}$ ed., SYBEX, 1987; and the ISSCC proceedings from 1975 to the present, all incorporated herein by reference.

While the invention has been specifically described with reference to several preferred embodiments, it will be understood by those of ordinary skill in the prior art having reference to the current specification and drawings that various modifications may be made and various alternatives are possible therein without departing from the spirit and scope of the invention.

For example:

Although the invention is described in relation to a DRAMs or SRAMs the invention can be used in other types of memories including read-only memories, FIFOs, EPROMs, EEPROMs, or flash memories without departing from the scope of the invention.

A microprocessor, microcontroller, digital signal processor, or any application specific integrated circuit that can process data can be used as the processor without departing from the scope of the invention.

Although the invention in described using a processor any logic that can process data can be used.

While the invention has been described as particularly useful in certain application, it can be used anywhere a processor and memory are used, and is particularly useful where quick access to the data stored in the memory is desired.

Although the external interconnect pads are all shown in FIG. 1 as input/output pads, some or all of the external interconnect pads can be just input pads or just output pads.

While the memory interconnect pads are all shown in FIG. 1 as input/output pads, some or all of the memory interconnect pads can be just input or just output pads.

We claim:

1. A method for testing an integrated circuit containing both memory and logic the method comprising the steps of:
    temporarily coupling said memory to one or more interconnect pads through a respective one or more switching circuits each having a respective control input in response to a second logic state on the control inputs of the one or more switching circuits;
    testing said memory; and
    coupling said logic to said one or more interconnect pads through said respective one or more switching circuits in response to a first logic state on the control inputs of said switching circuits.

2. The method of claim 1, further comprising the step of repairing said memory, conditionally performed after said step of testing said memory.

3. The method of claim 2 wherein said step of repairing said memory comprises replacing defective memory cells with redundant memory cells.

4. The method of claim 1, further comprising decoupling said memory from said one or more interconnect pads in response to said first logic state received on said control inputs.

5. The method of claim 1, further comprising:
    coupling said one or more interconnect pads to memory test equipment, performed before said step of testing said memory;
    setting a flag bit to a third logic state to signify said memory is non-defective and to a fourth logic state to signify said memory is defective, performed after the step of testing said memory;
    decoupling said one or more interconnect pads from said memory test equipment;
    responding to said third logic state at said flag bit, said responding comprising:
    coupling said one or more interconnect pads to logic test equipment;
    testing said logic; and
    decoupling said one or more interconnect pads from said logic test equipment.

6. The method of claim 5, responsive to said third logic state at said flag bit further comprising the step of final testing said integrated circuit, performed after said step of testing said logic.

7. A method of testing an integrated circuit containing a processor and an embedded memory the method comprising the steps of:
    coupling said memory to one or more interconnect pads through a respective one or more switching circuits each having a respective control input in response to a second logic state on the control inputs of said switching circuits;
    testing said memory;
    decoupling said memory from said one or more interconnect pads; and
    coupling said processor to said one or more interconnect pads through said respective one or more switching circuits in response to a first logic state on the control inputs of said switching circuits.

8. The method of claim 7, further comprising the step of testing said processor, performed after said step of coupling said processor to said one or more interconnect pads.

9. The method of claim 8, further comprising the steps of:
    coupling said processor to said one or more interconnect pads;
    testing said processor; and
    decoupling said processor from said one or more interconnect pads;
    wherein said step of coupling said memory to one or more interconnect pads is performed after said step of decoupling said processor from said one or more interconnect pads.

10. The method of claim 9 wherein said step of decoupling said processor from said one or more interconnect pads is in response to the second logic state on the control inputs of said switching circuits.

11. The method of claim 9 wherein said step of decoupling said processor from said one or more interconnect pads and said step of coupling said memory to said one or more interconnect pads are performed simultaneously.

12. The method of claim 7, further comprising the step of repairing said memory, conditionally performed after said step of testing said memory.

13. The method of claim 12 wherein said step of repairing said memory comprises replacing defective memory cells with redundant memory cells.

14. The method of claim 7 wherein said step of decoupling said memory from said one or more interconnect pads is in response to said first logic state received at said control input.

15. The method of claim 7 wherein said step of decoupling said memory from said one or more interconnect pads and said step of coupling said processor to said one or more interconnect pads are performed simultaneously.

16. The method of claim 7, further comprising the step of final testing said integrated circuit, performed after said step of coupling said processor to said one or more interconnect pads.

17. An integrated circuit comprising:
a processor;
a memory;
one or more interconnect pads;
one or more switching circuits each having a respective control input a respective first end, and a respective second end, each second end having a respective first and second terminal, each first end coupled to one of said one or more interconnect pads, each second end coupled to said processor through said first terminal in response to a first logic state received on said control input, and each second end coupled to said memory through said second terminal in response to a second logic state received on said control input.

18. The integrated circuit of claim 17, further comprising a memory test circuit coupled to each said control input for controlling said switching circuits.

19. The integrated circuit of claim 18, further comprising a current limiting device electrically coupled to ground, and to said memory test circuit and to said switching circuits.

20. The integrated circuit of claim 19 wherein said current limiting device comprises a transistor having a length and a width and wherein said length is greater than said width.

21. The integrated circuit of claim 17 wherein each said switching circuit couples said processor to one of said one or more interconnect pads and decouples said memory from one of said one or more interconnect pads in response to said first logic state on said control inputs.

22. The integrated circuit of claim 17 wherein each said switching circuit couples said memory to one of said one or more interconnect pads and decouples said processor from one of said one or more interconnect pads responsive to said second logic state on said control inputs.

23. The integrated circuit of claim 17 wherein each said switching circuit comprises a first and second pair of pass elements.

24. The integrated circuit of claim 23 wherein each said pass element comprises an n-channel transistor.

25. The integrated circuit of claim 17 wherein said processor comprises a digital signal processor.

26. The integrated circuit of claim 17 wherein said processor comprises a microprocessor.

27. The integrated circuit of claim 17 wherein said processor comprises a video compression device.

28. The integrated circuit of claim 17 wherein said memory comprises DRAM.

29. A computer comprising:
an input device;
an output device; and
an integrated circuit coupled to said input device and said output device comprising:
a processor;
a memory array;
one or more interconnect pads:
one or more switching circuits each having a respective control input, a respective first end, and a respective second end, each second end having a respective first and second terminal, each first end coupled to one of said one or more interconnect pads, each second end coupled to said processor through said first terminal in response to a first logic state received at said control input, and each second end coupled to said memory through said second terminal in response to a second logic state received at said control input.

30. The integrated circuit of claim 29, further comprising a memory test circuit coupled to each said control input for controlling said switching circuits.

31. The computer of claim 30, further comprising a current limiting device coupled to ground, and to said memory test circuit and to said switching circuits.

32. The computer of claim 31 wherein said current limiting device comprises a transistor having a length and a width and wherein said length is greater than said width.

33. The computer of claim 29 wherein each said switching circuit couples said processor to one of said one or more interconnect pads and decouples said memory from one of said one or more interconnect pads responsive to said first logic state on said control inputs.

34. The computer of claim 29 wherein each said switching circuit couples said memory to one of said one or more interconnect pads and decouples said processor from one of said one or more interconnect pads responsive to said second logic state on said control inputs.

35. The computer of claim 29 wherein each said switching circuit comprises a first and second pair of pass elements.

36. The computer of claim 35 wherein each said pass element comprises a pass gate having a pair of complementary transistors with their conduction paths coupled in parallel.

37. The computer of claim 29 wherein said processor comprises a microprocessor.

38. The computer of claim 29 wherein said memory comprises DRAM.

* * * * *